United States Patent
Matayabas, Jr. et al.

(10) Patent No.: US 7,224,050 B2
(45) Date of Patent: May 29, 2007

(54) PLASTIC MATERIALS INCLUDING DENDRIMERS OR HYPERBRANCHED POLYMERS FOR INTEGRATED CIRCUIT PACKAGING

(75) Inventors: James C. Matayabas, Jr., Chandler, AZ (US); Leonel R. Arana, Phoenix, AZ (US); Stephen E. Lehman, Jr., Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/138,203

(22) Filed: May 25, 2005

(65) Prior Publication Data

US 2006/0267223 A1 Nov. 30, 2006

(51) Int. Cl.
*H01L 23/29* (2006.01)
(52) U.S. Cl. .......... 257/678; 257/E23.11; 257/788; 257/787; 257/632; 257/642; 257/792; 525/474; 525/437; 525/452; 525/450; 430/270.1; 430/927; 430/311; 430/327; 430/315
(58) Field of Classification Search ........ 257/E23.119, 257/787, 788, 632, 642, 755, 756, 758–760, 257/700, 701, 40, 792; 525/474, 437, 452, 525/450; 430/270.1, 927, 311, 327, 315
See application file for complete search history.

(56) References Cited

U.S. PATENT DOCUMENTS

| 5,883,219 | A | * | 3/1999 | Carter et al. ................. 528/310 |
| 6,093,777 | A | * | 7/2000 | Sorensen et al. ........... 525/438 |
| 6,111,323 | A | * | 8/2000 | Carter et al. ................. 257/787 |
| 6,617,397 | B2 | * | 9/2003 | McNamara et al. ........ 525/302 |
| 6,812,298 | B2 | * | 11/2004 | Dvornic et al. .............. 525/474 |
| 6,844,028 | B2 | * | 1/2005 | Mao et al. ................... 427/384 |
| 6,872,800 | B1 | * | 3/2005 | Bouquerel et al. .......... 528/310 |
| 6,992,115 | B2 | * | 1/2006 | Hawker et al. ............... 521/25 |
| 2002/0151652 | A1 | * | 10/2002 | Adedeji ...................... 525/133 |
| 2006/0088499 | A1 | * | 4/2006 | Percec ..................... 424/78.27 |
| 2006/0105181 | A1 | * | 5/2006 | Lin et al. .................... 428/447 |

* cited by examiner

*Primary Examiner*—Alexander Oscar Williams
(74) *Attorney, Agent, or Firm*—Blakely, Sokoloff, Taylor & Zafman LLP

(57) ABSTRACT

Integrated circuit packages and their manufacture are described, wherein the packages comprise dendrimers or hyperbranched polymers. In some implementations, the dendrimers or hyperbranched polymers include repeat units having one or more ring structures and having surface groups to react with one or more components of a plastic. In some implementations, the dendrimers or hyperbranched polymers have a glass transition temperature of less than an operating temperature of the integrated circuit and form at least a partially separate phase.

11 Claims, 3 Drawing Sheets

US 7,224,050 B2

PLASTIC MATERIALS INCLUDING DENDRIMERS OR HYPERBRANCHED POLYMERS FOR INTEGRATED CIRCUIT PACKAGING

BACKGROUND INFORMATION

Plastics have become commonplace materials in nearly every aspect of modern society. Their prevalence is due in part to the ability to create plastics with desirable properties such as heat tolerance, high strength, chemical resistance, etc. As the applications for plastics grow, efforts continue to further improve the desirable properties and to control other properties.

One property of interest is the coefficient of thermal expansion (CTE). Some applications for plastics require the materials to undergo temperature cycling with a minimum of thermal expansion. A typical solution for controlling thermal expansion is to modify the plastic through the addition of a low-CTE filler such as silica. The addition of silica may be effective to reduce CTE, but may in turn adversely affect other properties of the plastic, such as the viscosity of the uncured plastic.

Another property of interest is the toughness of the plastic. A typical solution for improving toughness is to modify the plastic through the addition of a rubber-like agent such as polybutadiene. The addition of polybutadiene may be effective to improve toughness, but may in turn adversely affect other properties of the plastic.

BRIEF DESCRIPTION OF THE DRAWINGS

Some implementations of the present invention are illustrated, by way of example and not limitation, in the accompanying figures, in which like references indicate similar elements and in which.

DETAILED DESCRIPTION

In the following description numerous specific details are set forth. However, it is understood that some embodiments may be practiced without these specific details. It is also understood that the description of particular embodiments is not to be construed as limiting the disclosure to those embodiments. Well-known circuits, structures and techniques have not been shown in detail in order not to obscure the understanding of this description.

As used herein, next level package refers to any type of packaging bonded to the semiconductor die. A next level package may be a substrate, a flexible substrate, an interposer, a printed wiring board, and/or any other suitable component.

As used herein, binder, or binder system, refers to any type of material that is capable of adhering to the semiconductor die and the next level package. A binder may include, for example, a thermoset epoxy resin, though embodiments of the present invention are not limited thereto.

Figure 1:
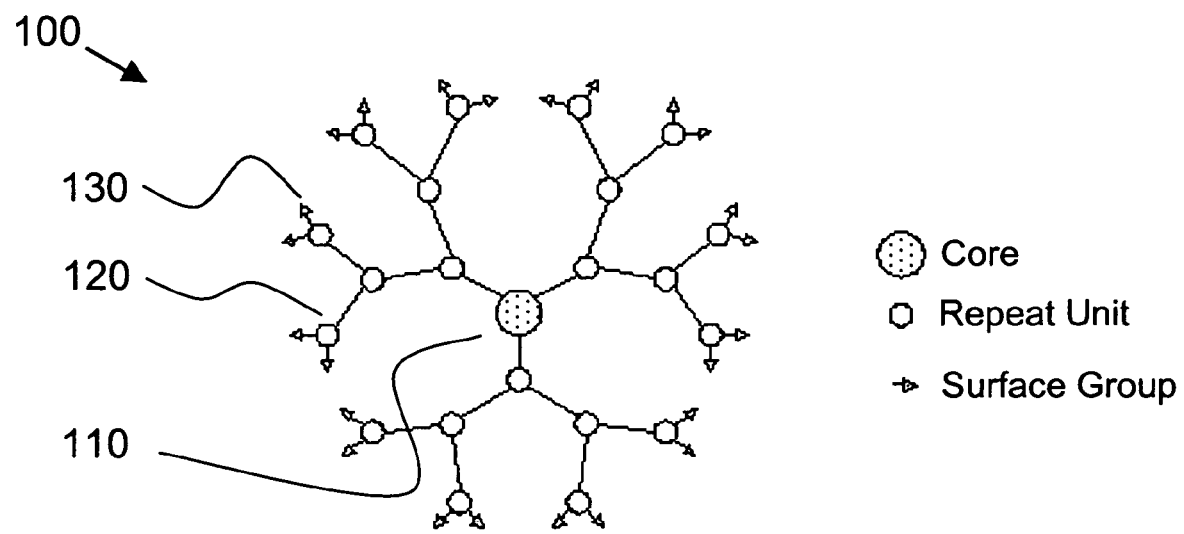
FIG. 1 is a representation of a dendrimer.
Figure 2:
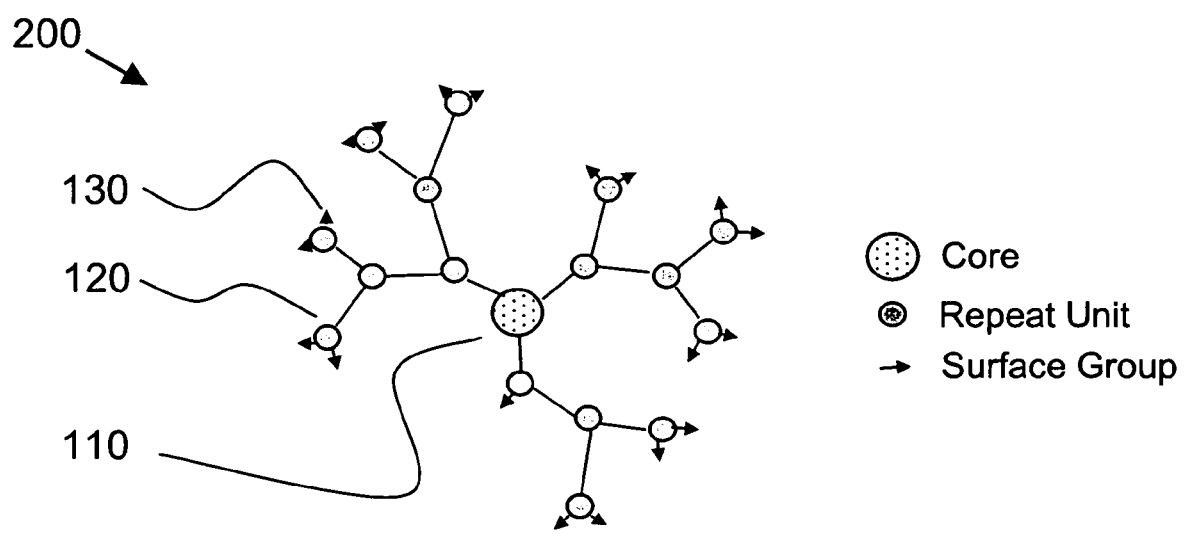
FIG. 2 is a representation of a hyperbranched polymer.

Some implementations of the present invention include plastics that incorporate dendrimers and/or hyperbranched polymers as CTE-reducing agents and/or tougheners. FIGS. 1 and 2 illustrate representations of a dendrimer 100 and a hyperbranched polymer 200. Dendrimer 100 and hyperbranched polymer 200 are highly-branched molecules consisting of a core 110, repeat units 120, and surface groups 130. Core 110 is typically a polyfunctional moiety, such that at least two branches extend outward from this moiety. Typical dendrimer cores include, but are not limited to, ethylene diamine, diaminobutane, and diaminohexane. Typical hyperbranched polymer cores include, but are not limited to, polyalcohols such as trimethylolpropane and pentaerythritol.

Repeat units 120 are typically related to molecules with one reactive group of a certain type, and two reactive groups of a different type, sometimes referred to as AB2 or A2B molecules. Dendrimers 100 and hyperbranched polymers 200 come in many chemical compositions, which include, but are not limited to, poly(amidoamine) and polyesters, such as those based on dimethylol propionic acid. Repeat units 120 generally branch outwards from a central core to form a tree-like molecule.

Surface groups 130 are generally located at the termini of repeat units 120. Generally, surface groups 130 are at the outer periphery of dendrimer 100 or hyperbranched polymer 200, though surface groups 130 may appear at the termini of repeat units 120 wherever they exist, including termini which are not at the outer periphery of dendrimer 100 or hyperbranched polymer 200. Surface groups 130 may or may not be reactive. Surface groups 130 may include, but are not limited to, hydroxyls, amines, epoxy groups, organosilicones, and carboxylates.

Dendrimer 100 and hyperbranched polymer 200, while similar in structure, may be distinguished by their synthesis routes and by their degree of polydispersity. Dendrimer 100 is generally synthesized in a step-wise fashion, wherein selected functional groups are protected and deprotected in such a way that dendrimer 100 can be grown one layer (or "generation") at a time. This technique enables the synthesis of dendrimer 100 with a high degree of symmetry and a low degree of polydispersity.

Hyperbranched polymer 200 is generally synthesized without the use of protection groups to control the growth, but rather through the control of stoichiometric ratios and processing conditions. Hyperbranched polymer 100 may be less symmetric and more polydisperse than dendrimer 100.

Dendrimer 100 and hyperbranched polymer 200 may be formed with repeating units 120 containing ring type structures. These dendrimers 100 and hyperbranched polymers 200 may exhibit a more rigid structure than analogous materials that lack ring type structures, may exhibit a lower CTE than the analogous materials, and may exhibit a higher glass transition temperature than the analogous materials. Some implementations of the invention may incorporate aromatic or alicyclic ring structures and may have ring structures that include carbon and/or heteroatoms.

Both dendrimers 100 and hyperbranched polymers 200 may also be formed with various surface groups 130. Surface groups 130 may have functionality to enable dendrimers 100 and hyperbranched polymers 200 to react with one or more other components of a plastic or other binder system. For example, dendrimers 100 or hyperbranched polymers 200 may be formed with functional surface groups 130 that react with an epoxy resin and/or hardener and which may crosslink the plastic. Such a plastic may exhibit a lower CTE than an analogous, non-crosslinked plastic.

Figure 3:
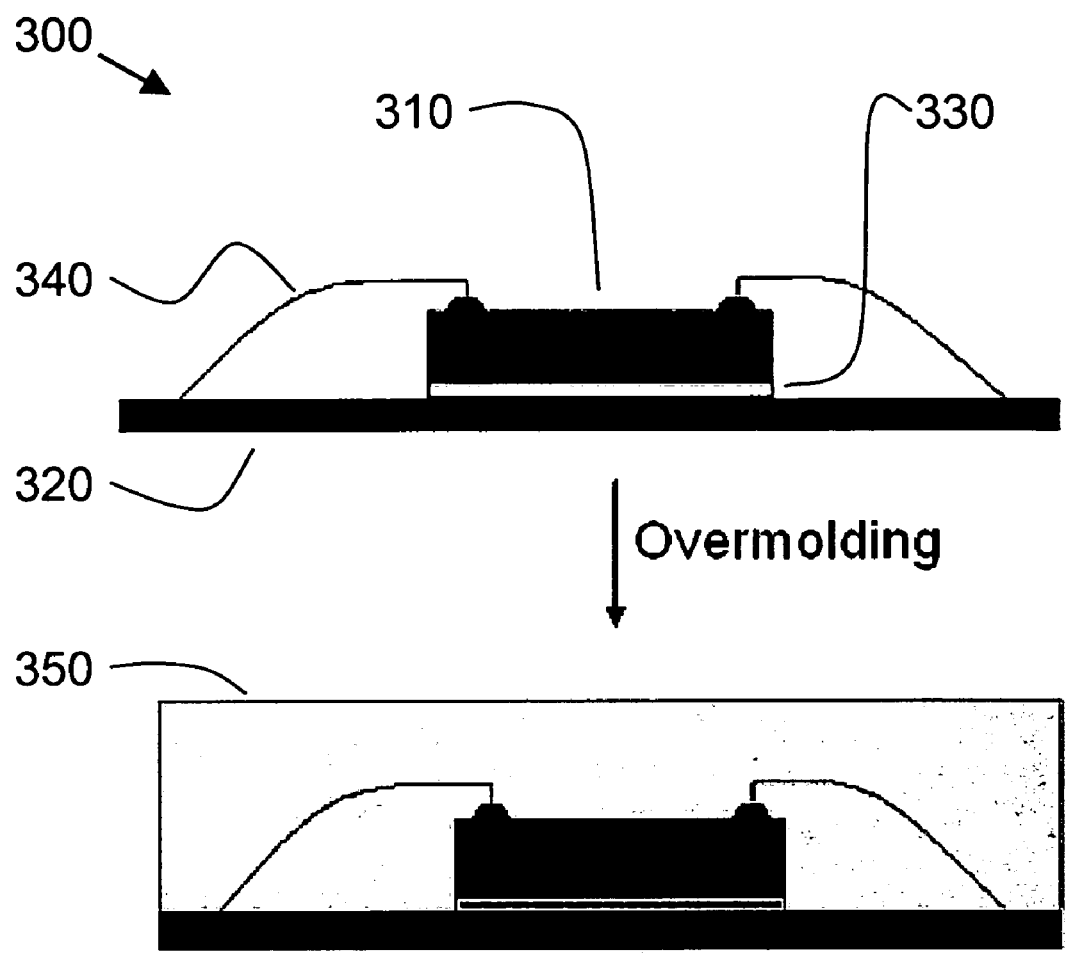
FIG. 3 illustrates a cross-section of an integrated circuit package before and after overmolding.

FIG. 3 illustrates a cross-sectional representation of an integrated circuit package 300 before and after overmolding with a mold compound 350. In an implementation, an integrated circuit die 310 is shown bonded to a next level package 320. Next level package 320 may be any suitable component, such as a substrate, printed circuit board, etc. Die 310 may be bonded by a bonding compound 330, such as an underfill, eutectic solder, etc. Die 310 may also be bonded to next level package 320 by mold compound 350 used for overmolding, as, for example, in a molded matrix array package (MMAP), though implementations of the invention are not limited to MMAP packages. Die 310 may be electrically coupled to next level package 320 by wire-bonds 340. Die 310 may be overmolded with mold compound 350. Mold compound 350 may contain dendrimers 100 and/or hyperbranched polymers 200 having repeating units 120 containing ring type structures. Mold compound 350 may contain dendrimers 100 and/or hyperbranched polymers 200 having surface groups 130 having functionality to enable dendrimers 100 or hyperbranched polymers 200 to react with one or more other components of mold compound 350.

In an example, integrated circuit package 300 may include an overmold 350 formed with an epoxy and a hyperbranched polymer 200 having repeating units 120 that include an unsaturated six-membered ring and having surface groups 130 with epoxide functionality. Hyperbranched polymer 200 may be formed by reacting 3,5-dihydroxybenzoic acid with a base in a polar, aprotic solvent at elevated temperatures. Hyperbranched polymer 200 may then be isolated by precipitation or any other suitable means. After drying and/or other suitable preparations, hyperbranched polymer 200 may be epoxylated with epichlorohydrin by techniques well known in the art. Hyperbranched polymer 200 may have approximately 0.05 to 0.01 epoxy equivalents per gram.

Hyperbranched polymer 200 formed by the process just described may be used to prepare a mold compound by dry blending the following in a blender having a grinding blade with cooling to maintain a temperature below approximately 25° C. (25 degrees centigrade): 8.6 grams of epoxylated tetramethyl biphenyl phenol, 7.0 grams of novolak resin comprising about 0.0056 equivalents per gram, 0.3 g of carnauba wax, 0.05 grams of triphenyl phosphine, and 0.39 grams of hyperbranched polymer 200. The mixture may then be processed in a roll mill at approximately 110° C. The resulting material may then be ground and pressed into pellets, which may be used to overmold integrated circuit die 310 to form integrated circuit package 300 by transfer molding at approximately 165° C.

In an example, integrated circuit package 300 may include an overmold 350 formed with an epoxy matrix and a dendrimer 100 having repeating units 120 that include an unsaturated six-membered ring and having surface groups 130 with epoxide functionality. Dendrimer 100 may be formed by reacting a core molecule such as pentaerythritol with base in an aprotic solvent and an excess of 3,5-di-trimethylsiloxybenzoic acid. The product may then be subjected to aqueous workup and dried, then deprotected to the free alcohol with tetrabutylammonium fluoride. The resulting compound is a first generation dendrimer and may have a phenolic functionality of 8.0, a molecular weight of 568 grams/mole, and 0.14 equivalents per gram.

Further generations of this compound may be obtained by continuing in a like fashion. The compound can be reacted with base in an aprotic solvent and an excess of 3,5-di-trimethylsiloxybenzoic acid. Following the reaction, the product may be subjected to aqueous workup and dried, then deprotected to the free alcohol with tetrabutylammonium fluoride. The resulting compound is a second generation dendrimer and has a phenolic functionality of 16.0, a molecular weight of 1441 grams/mole, and 0.011 equivalents per gram. Continuing repetitions may be employed to generate third, fourth and fifth generation dendrimers, with functionalities of 32, 64, and 128; molecular weights of 3187, 6678, and 13660 grams per mole; and equivalents of 0.010, 0.010, and 0.009 equivalents per gram, respectively. After drying and/or other suitable preparations, dendrimer 100 may be epoxylated with epichlorohydrin by techniques well known in the art. Dendrimer 100 may be a single generation, or may be a mixture of two or more generations.

Dendrimer 100 formed by the process just described may be used to prepare a mold compound by dry blending the following in a blender having a grinding blade with cooling to maintain a temperature below approximately 25° C.: 8.6 grams of epoxylated tetramethyl biphenyl phenol, 7.0 grams of novolak resin comprising about 0.0056 equivalents per gram, 0.3 g of carnauba wax, 0.05 grams of triphenyl phosphine, and 0.78 grams of third-generation dendrimer 100. The mixture may then be processed in a roll mill at approximately 110° C. The resulting material may then be ground and pressed into pellets, which may be used to overmold integrated circuit 310 to form integrated circuit package 300 by transfer molding at approximately 165° C.

Implementations of the materials disclosed herein may incorporate dendrimers and/or hyperbranched polymers as toughening agents for integrated circuit packaging. Toughening agents according to implementations of the present invention may enable the production of plastics with a lower modulus of elasticity than analogous materials made with traditional components. Dendrimers and/or hyperbranched polymers may be incorporated into the plastic and processed through controlled phase separation to form a distinct phase that is richer in the dendrimer and/or hyperbranched polymer than the surrounding material.

In some implementations, dendrimers and/or hyperbranched polymers may have surface groups 130 which are non-reactive or mildly reactive towards other components of the plastic. In some implementations, dendrimers 100 and/or hyperbranched polymers 200 may have a glass transition temperature below an operating temperature of the packaged integrated circuit. Thus, for typical integrated circuit packages, plastics may incorporate dendrimers 100 and/or hyperbranched polymers 200 having glass transition temperatures below about room temperature to approximately 125° C.

In an example, integrated circuit package 300 may include an overmold 350 formed with an epoxy matrix and a dendrimer 100 and/or a hyperbranched polymer 200 having a glass transition temperature below an operating temperature of the integrated circuit package 300. In some implementations, the glass transition temperature of the dendrimer 100 and/or hyperbranched polymer 200 may be below approximately room temperature to approximately 125° C. In an implementation, dendrimer 100 may be used to prepare mold compound 350 by dry blending the following in a blender having a grinding blade with cooling to maintain a temperature below approximately 25° C.: 8.6 grams of epoxylated tetramethyl biphenyl phenol; 9.8 grams of novolak resin (comprising 0.50 equivalents per gram); 79 grams of silica; 0.3 grams of carnauba wax; 0.2 grams of 3,4-epoxypropyl trimethoxy silane; 0.05 grams of triphenyl phosphine; and 2.0 grams of dendrimer 100. Dendrimer 100 may be, for example, a material such as "Boltorn H30" manufactured by Perstorp. The mixture may then be processed in a roll mill at approximately 110° C. The resulting material may then be ground and pressed into pellets, which may be used to overmold integrated circuit 310 to form integrated circuit package 300 by transfer molding at approximately 165° C.

Figure 4:
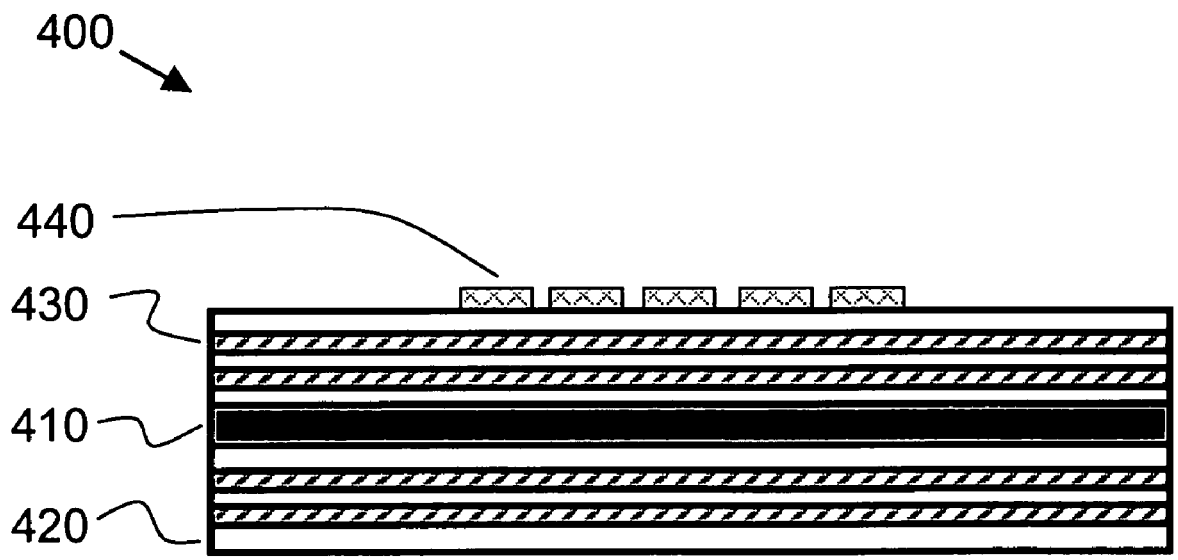
FIG. 4 illustrates a cross-section of a next level package.

In some implementations, it may be desirable to control the phase separation of dendrimer 100 and/or hyperbranched polymer 200 by providing surface groups 130 having functionality capable of reacting with one or more other components of the plastic. FIG. 4 illustrates a cross-sectional representation of a next level package 400. Next level package 400 may be, for example, an integrated circuit substrate, an interposer, etc. In an implementation, dendrimer 100 may be used to form portions of next level package 400. For example, next level package 400 may include core 410, one or more dielectric layers 420, and one or more metal layers 430. Dielectric layers 420 may be prepared by combining the following in a planetary mixer, heated to approximately 80° C. and mixed at about 50 rpm for approximately 1 hour: 210 parts of methyl ethyl ketone; 20 parts of diglycidyl bisphenol-A; 20 parts of tetrabromo bisphenol-A; 20 parts of ortho-cresol novolak epoxy resin having 215 grams per equivalent; 15 parts of dendrimer 100 having surface groups 130 having epoxy functionality; 50 parts of brominated phenolic novolak resin; 3 parts of imidazole; and 11 parts of silica which may have an average particle size of less than 5 microns. Dendrimer 100 may be, for example, a material such as "Boltorn E1" manufactured by Perstorp. The resulting material may then be cast on to a Mylar film and dried at approximately 100° C. for about 15 minutes to provide a film having a thickness of about 30 microns, which may be laminated by vacuum lamination at approximately 120° C. and 1 torr onto core 410 of next level package 400 to form one or more dielectric layers 420. Contact pads 440 can be formed on top of a final dielectric layer 420.

Figure 5:
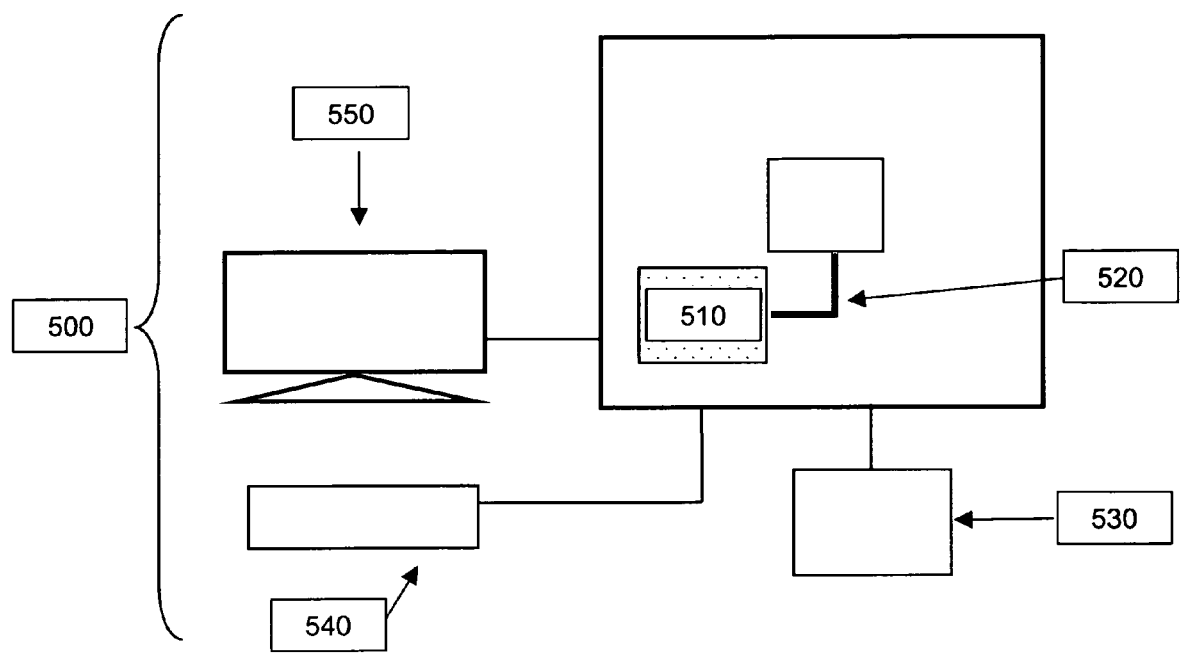
FIG. 5 illustrates a simplified schematic of an electronic system.

FIG. 5 illustrates a simplified schematic of an electronic system 500 according to some implementations of the invention. The electronic system 500 may include a component 510, a bus 520, a main memory 530, an alphanumeric input device 540, and a video display device 550. Electronic system 500 may incorporate one or more components 510 comprising one or more integrated circuit packages 300 of FIG. 3. Component 510 may be, for example, a microprocessor, digital signal processor, application-specific integrated circuit (ASIC), etc. Component 510 may be coupled to other parts of electronic system 500 via a bus 520.

While certain exemplary embodiments have been described and shown in the accompanying drawings, it is to be understood that such embodiments are merely illustrative and not restrictive of the current invention, and that this invention is not restricted to the specific constructions and arrangements shown and described since modifications may occur to those ordinarily skilled in the art.

What is claimed is:

1. An integrated circuit package, comprising:
   an integrated circuit; and
   a packaging material overmolding the integrated circuit, the packaging material comprising a plastic, the plastic comprising one of dendrimers or hyperbranched polymers that have a glass transition temperature of about 50 C or greater;
   wherein the dendrimers or hyperbranched polymers include repeat units having one or more ring structures and having surface groups having moieties to react with one or more components of the plastic.

2. The integrated circuit package of claim 1, wherein the dendrimers or hyperbranched polymer has one or more aromatic ring structures.

3. The integrated circuit package of claim 2, wherein the dendrimer or hyperbranched polymer is prepared from 3,5-dihydroxybenzoic acid or 3,5-di-trimethylsiloxybenzoic acid.

4. The integrated circuit package of claim 3, wherein the plastic is an epoxy.

5. The integrated circuit package of claim 1, wherein the dendrimer or hyperbranched polymer has one or more cycloaliphatic ring structures.

6. The integrated circuit of claim 1, wherein the plastic is a mold compound.

7. The integrated circuit package of claim 1, wherein the package is a molded matrix array package (MMAP) package.

8. An integrated circuit package, comprising:
   an integrated circuit; and
   a packaging material overmolding the integrated circuit, the packaging material comprising an epoxy matrix and one of dendrimers or hyperbranched polymers having a glass transition temperature of less than an operating temperature of the integrated circuit, wherein the dendrimers or hyperbranched polymers form at least a partially separate phase from the epoxy matrix phase.

9. The integrated circuit package of claim 8, wherein the operating temperature of the integrated circuit is less than about 125 C.

10. The integrated circuit package of claim 9, wherein the packaging material is an epoxy mold compound, and wherein the epoxy matrix comprises novolak resin and epoxylated tetramethyl biphenyl.

11. An integrated circuit package, comprising:
    an integrated circuit; and
    a plastic comprising one of dendrimers or hyperbranched polymers having a glass transition temperature of less than an operating temperature of the integrated circuit, wherein the dendrimers or hyperbranched polymers form at least a partially separate phase, wherein the plastic is an epoxy mold compound, and wherein the epoxy matrix comprises novolak resin and epoxylated tetramethyl biphenyl.

* * * * *